(12) United States Patent  
Meinel et al.

(10) Patent No.: US 8,586,395 B2  
(45) Date of Patent: Nov. 19, 2013

(54) METHOD AND APPARATUS FOR REDUCING THERMOPILE VARIATIONS

(75) Inventors: Walter Meinel, Tucson, AZ (US); Kalin V. Lazarov, Colorado Springs, CO (US)

(73) Assignee: Texas Instruments Incorporated, Dallas, TX (US)

( * ) Notice: Subject to any disclaimer, the term of this patent is extended or adjusted under 35 U.S.C. 154(b) by 219 days.

(21) Appl. No.: 12/962,257

(22) Filed: Dec. 7, 2010

(65) Prior Publication Data

US 2012/0139077 A1 Jun. 7, 2012

(51) Int. Cl.  
*H01L 31/024* (2006.01)  
*H01L 31/101* (2006.01)

(52) U.S. Cl.  
USPC ........ 438/54; 438/55; 438/739; 257/E29.347; 257/E31.093

(58) Field of Classification Search  
CPC .................................................. H01L 26/66992  
USPC .................................................. 257/E29.347  
See application file for complete search history.

(56) References Cited

U.S. PATENT DOCUMENTS

| | | | | |
|---|---|---|---|---|
| 8,304,850 | B2 * | 11/2012 | Lazarov et al. | 257/467 |
| 2003/0222218 | A1 * | 12/2003 | Nozu | 250/338.1 |
| 2006/0262829 | A1 | 11/2006 | Manlove et al. | |
| 2010/0213373 | A1 * | 8/2010 | Meinel et al. | 250/338.4 |
| 2010/0327393 | A1 * | 12/2010 | Meinel et al. | 257/467 |
| 2011/0057285 | A1 * | 3/2011 | Mueller et al. | 257/467 |
| 2012/0086098 | A1 * | 4/2012 | Meinel et al. | 257/467 |

* cited by examiner

*Primary Examiner* — Stephen W Smoot  
(74) *Attorney, Agent, or Firm* — Alan A. R. Cooper; W. James Brady, III; Frederick J. Telecky, Jr.

(57) ABSTRACT

Here, an apparatus is provided. The apparatus generally comprises a substrate and a thermopile. The thermopile includes a cavity that is etched into the substrate, a functional area that is formed over the substrate (where the cavity is generally coextensive with the functional area), and a metal ring formed over the substrate along the periphery of the functional area (where the metal ring is thermally coupled to the substrate).

4 Claims, 12 Drawing Sheets

METHOD AND APPARATUS FOR REDUCING THERMOPILE VARIATIONS

TECHNICAL FIELD

The invention relates generally to thermal stabilization of a thermopile and, more particularly, to the use of a metal ring for thermal stabilization of a thermopile.

BACKGROUND

When a thermopile employs a membrane, it can be important to maintain a generally constant or fixed thermal conductivity for the membrane. However, conventional solutions that have been employed are generally inadequate for many newly developed thermopiles (which employ a membrane). Therefore, there is a need for an apparatus and/or method that maintains a generally constant thermal conductivity for a membrane of a thermopile. An example of a conventional method and/or apparatus is U.S. Patent Pre-Grant Publ. No. 2006/0262829.

SUMMARY

A preferred embodiment of the present invention, accordingly, provides an apparatus. The apparatus comprises a substrate; and a thermopile including: a cavity that is etched into the substrate; a functional area that is formed over the substrate, wherein the cavity is generally coextensive with the functional area; and a metal ring formed over the substrate along the periphery of the functional area, wherein the metal ring is thermally coupled to the substrate.

In accordance with a preferred embodiment of the present invention, the metal ring further comprises a plurality of metallization layers formed over the substrate with thermally conductive layers formed therebetween.

In accordance with a preferred embodiment of the present invention, the metal ring further comprises: a first via layer formed over the substrate; a first metallization layer formed over the first via layer; a second via layer formed over the first metallization layer; a second metallization layer formed over the second via layer; a third via layer formed over the second metallization layer, wherein the first, second, and third via layers are formed of a thermally conductive material; and a third metallization layer that is formed over the third via layer.

In accordance with a preferred embodiment of the present invention, the apparatus further comprises a passivation layer formed over the thermopile.

In accordance with a preferred embodiment of the present invention, the apparatus further comprises a plurality of openings extend through the passivation layer and the functional area to the substrate.

In accordance with a preferred embodiment of the present invention, the apparatus further comprises a cover plate formed over the passivation layer.

In accordance with a preferred embodiment of the present invention, the cover plate is formed of an epoxy, and wherein the first, second, and third via layers are each formed of copper, aluminum, or tungsten, and wherein the first second and third metallization layers are formed of aluminum or copper.

In accordance with a preferred embodiment of the present invention, an apparatus is provided. The apparatus comprises a substrate; a thermopile including: a cavity that is etched into the substrate; a functional area that is formed over the substrate, wherein the cavity is generally coextensive with the functional area; and a metal ring formed over the substrate along the periphery of the functional area, wherein the metal ring is thermally coupled to the substrate; and functional circuitry formed on the substrate and electrically coupled to the thermopile.

In accordance with a preferred embodiment of the present invention, the functional circuitry further comprises an analog-to-digital converter.

In accordance with a preferred embodiment of the present invention, a method is provided. The method comprises forming a plurality of metallization layers and a functional over a substrate, wherein each metallization layer is thermally coupled to the substrate, and wherein the plurality of metallization layers are generally aligned with one another so as to form a metal ring along the periphery of the functional area; forming a passivation layer over the thermopile; forming a plurality of openings that extend through the passivation layer and the functional area to the substrate; and etching the substrate underneath the functional area to form a cavity, wherein the cavity extends to the periphery of the functional area.

In accordance with a preferred embodiment of the present invention, the method further comprises forming a cover plate over the passivation layer to seal the plurality of openings.

In accordance with a preferred embodiment of the present invention, the step of forming the plurality of metallization layers and the thermopile on the substrate further comprises: forming a first via layer formed over the substrate; forming a first metallization layer formed over the first via layer; forming a second via layer formed over the first metallization layer; forming a second metallization layer formed over the second via layer; forming a third via layer formed over the second metallization layer, wherein the first, second, and third via layers are formed of a thermally conductive material; and forming a third metallization layer that is formed over the third via layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
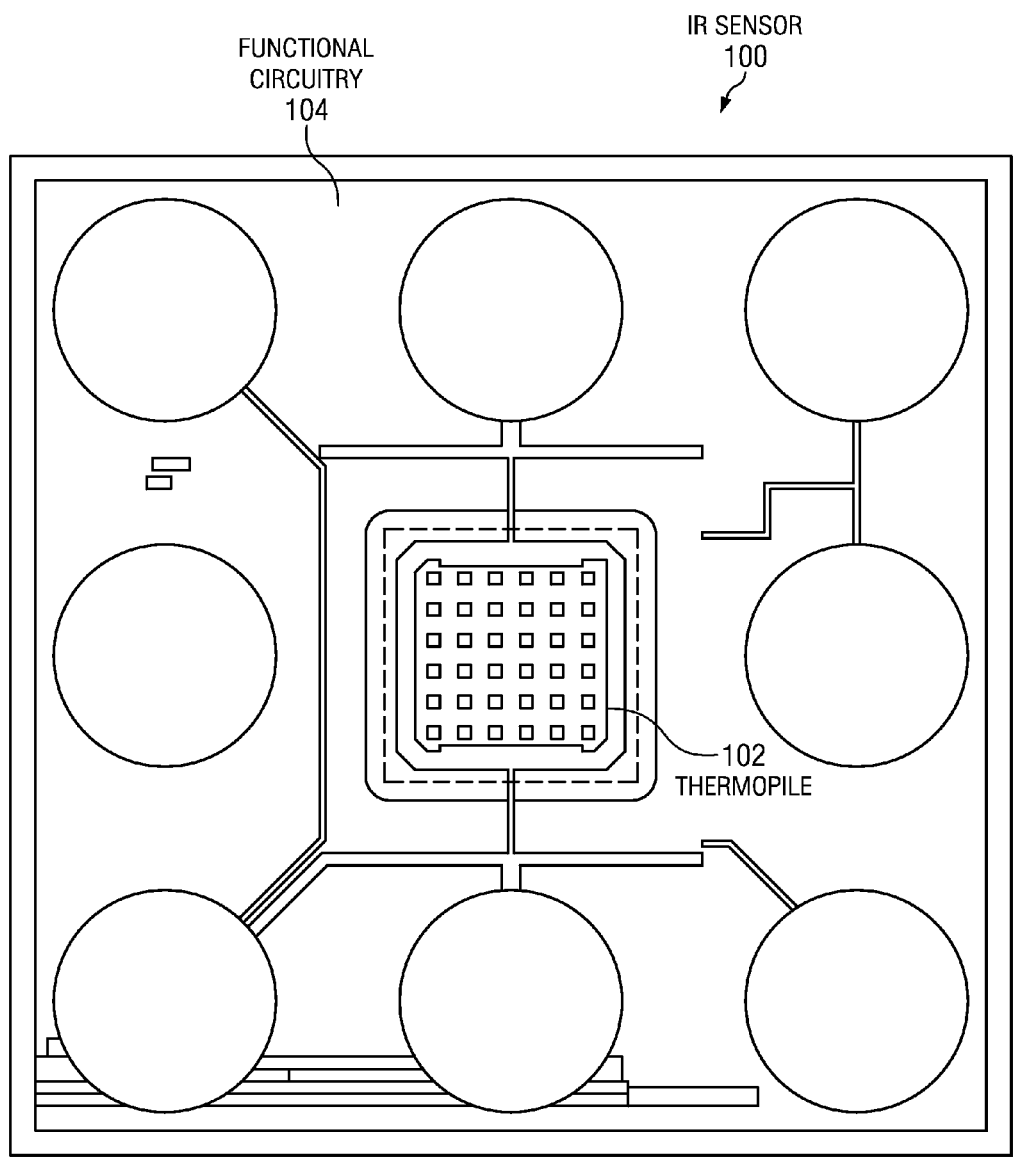
FIG. 1A is a plan view of the layout of an example of an infrared (IR) sensor in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1A of the drawings, the reference numeral 100 generally designates an example of an IR sensor in accordance with a preferred embodiment of the present invention. The IR sensor 100 generally comprises a thermopile 102 and functional circuitry 104 (which may be, for example, an analog-to-digital converter or ADC). The thermopile 102 may be formed on the same die as the functional circuitry 104, and the thermopile 102 is electrically coupled to functional circuitry 104.

Figure 1B:
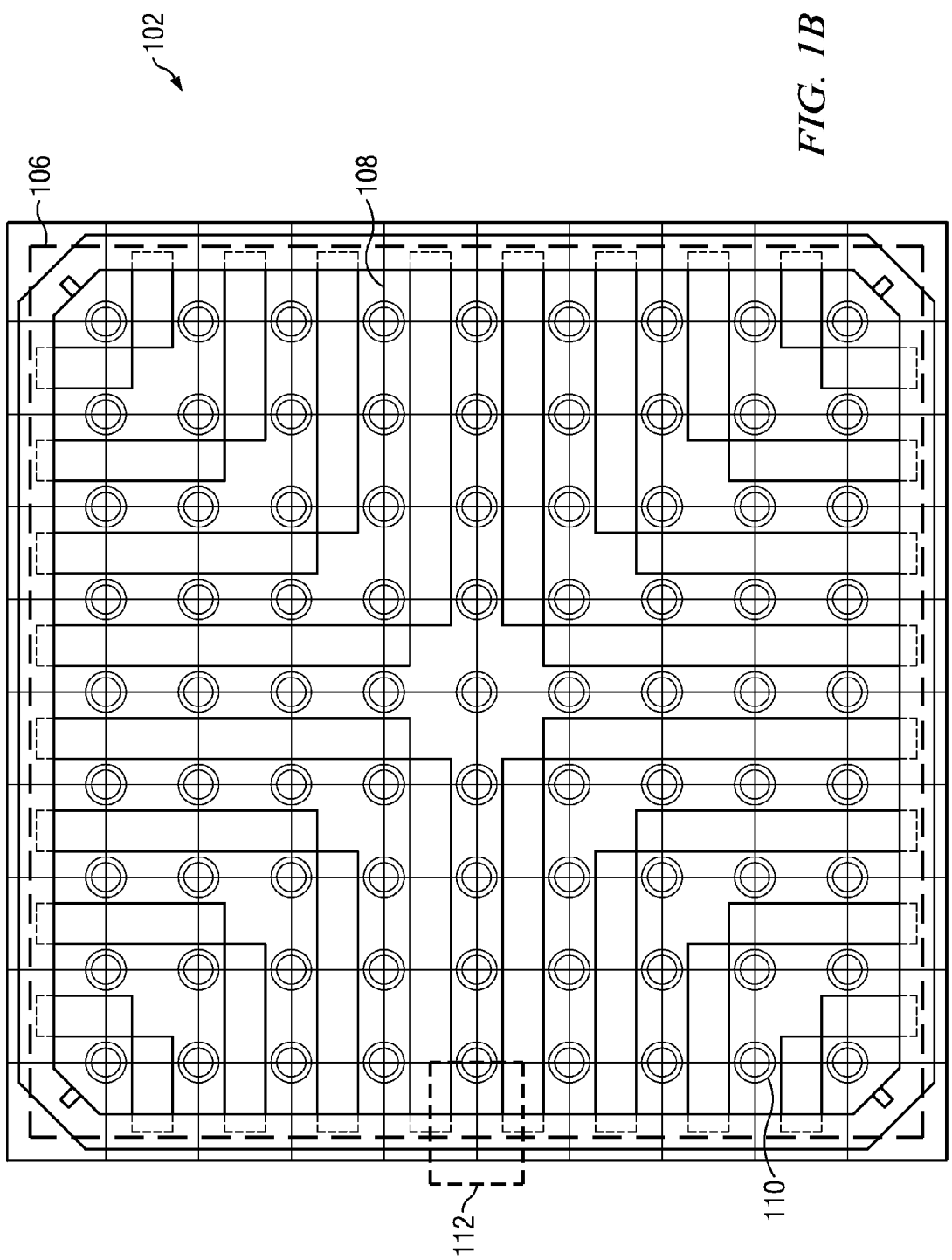
FIG. 1B is a plan view of the layout of the thermopile of FIG. 1.
Figure 2A:
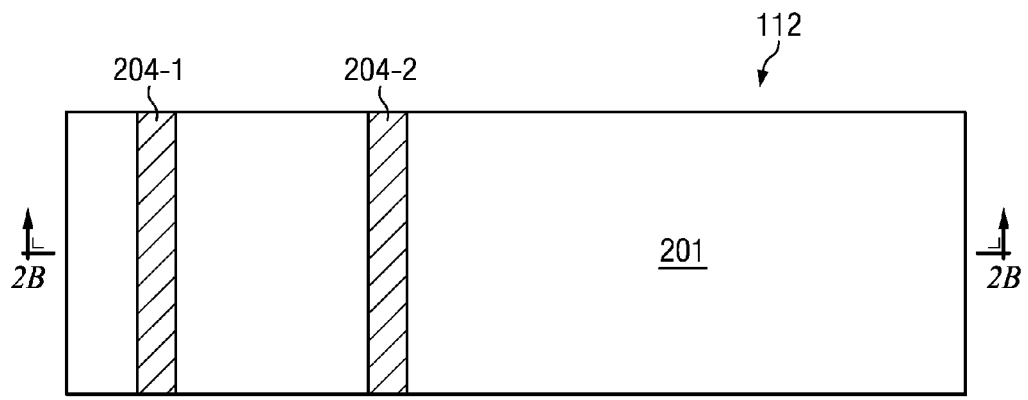
FIG. 2A is plan view of the formation of inner and outer via layers for a portion of the metal ring of FIG. 1B.
Figure 2B:
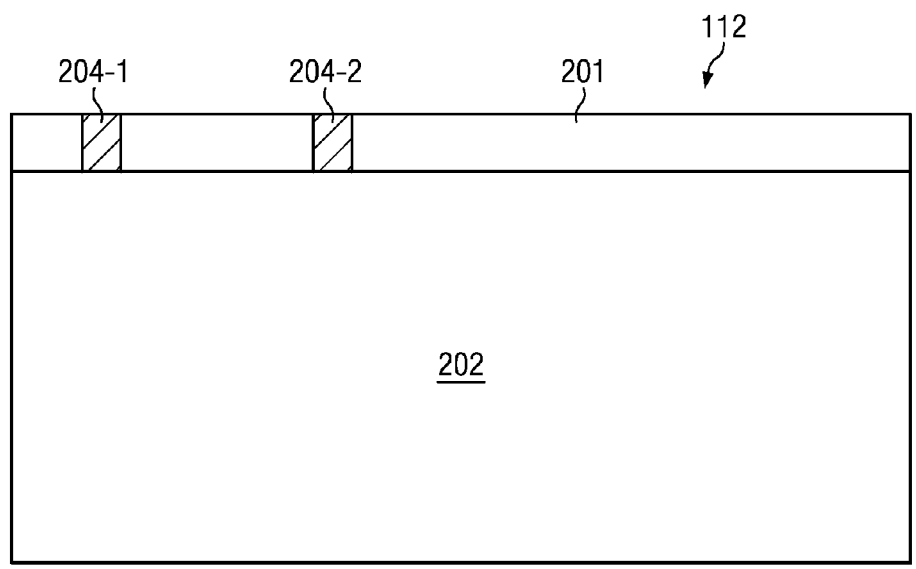
FIG. 2B is a cross-sectional view of FIG. 2A along section line 1-1.
Figure 3A:
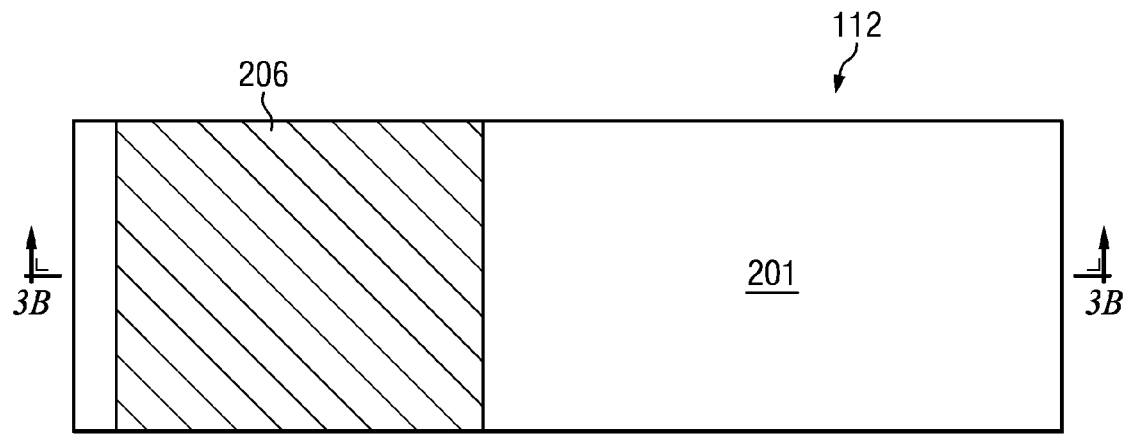
FIG. 3A is plan view of the formation of a metallization layer for a portion of the metal ring of FIG. 1B.
Figure 3B:
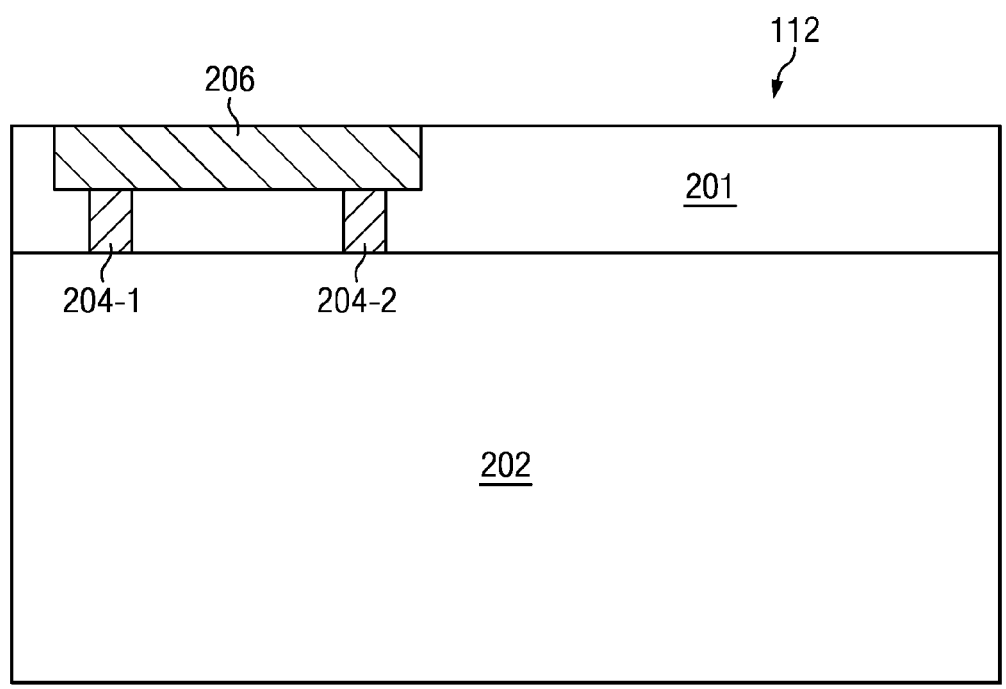
FIG. 3B is a cross-sectional view of FIG. 3A along section line 2-2.
Figure 4A:
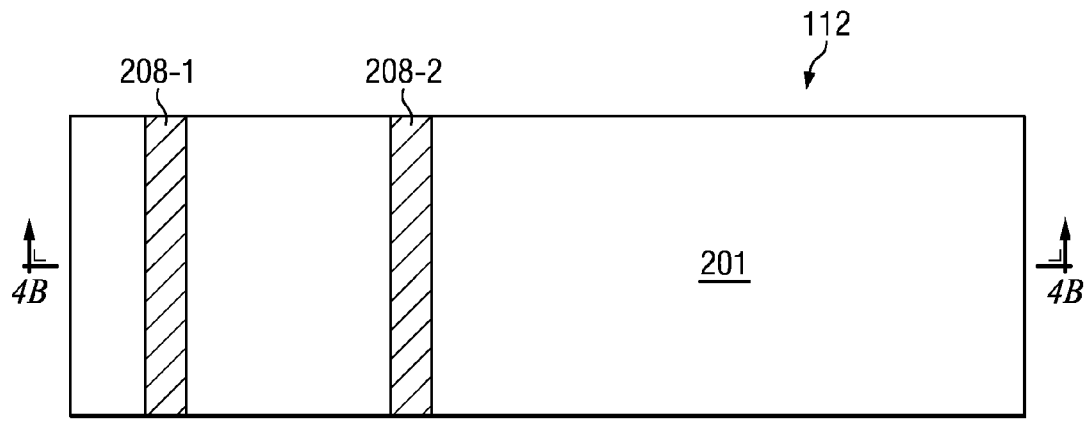
FIG. 4A is plan view of the formation of inner and outer via layers for a portion of the metal ring of FIG. 1B.
Figure 4B:
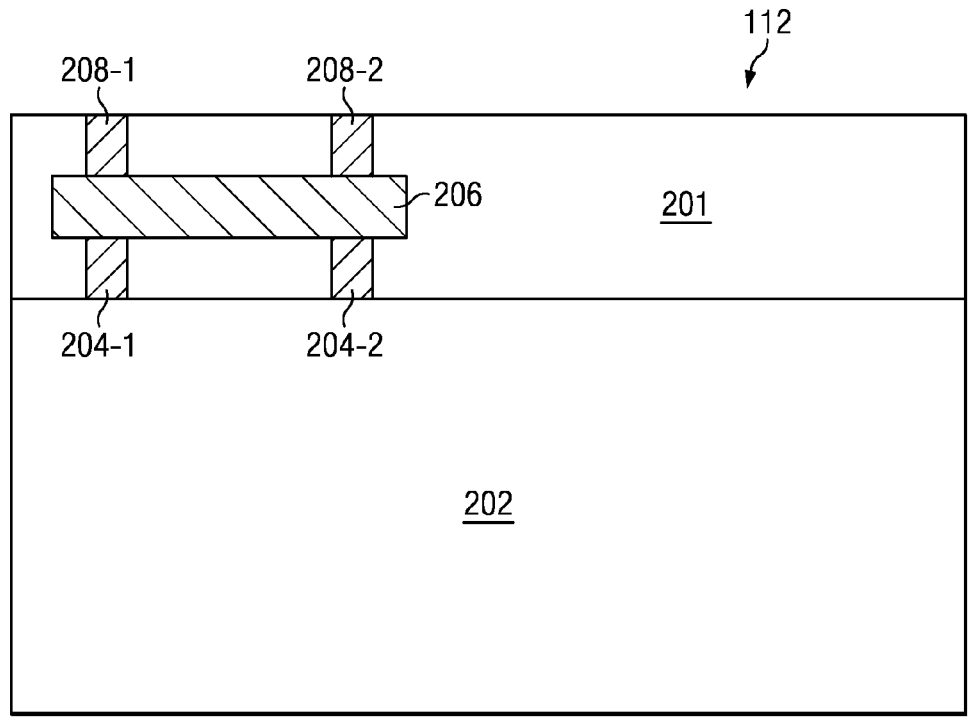
FIG. 4B is a cross-sectional view of FIG. 4A along section line 3-3.
Figure 5A:
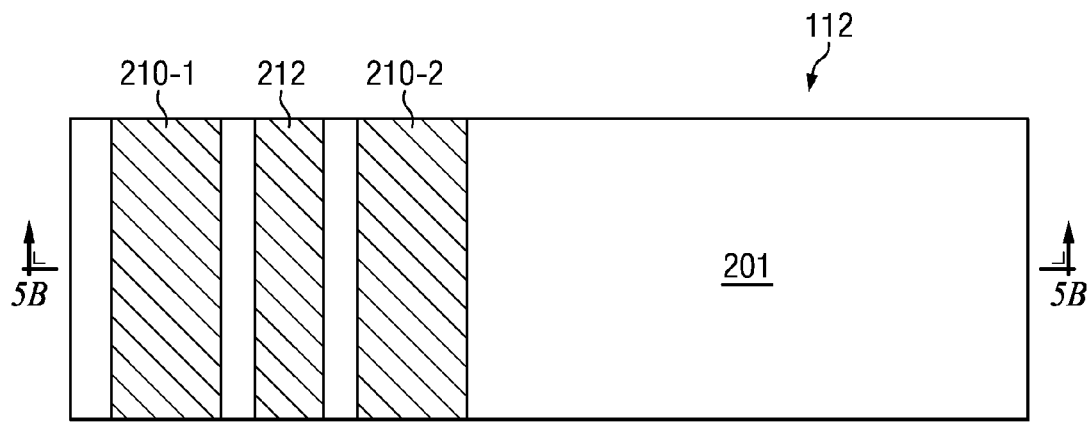
FIG. 5A is plan view of the formation of a metallization layer for a portion of the metal ring of FIG. 1B.
Figure 5B:
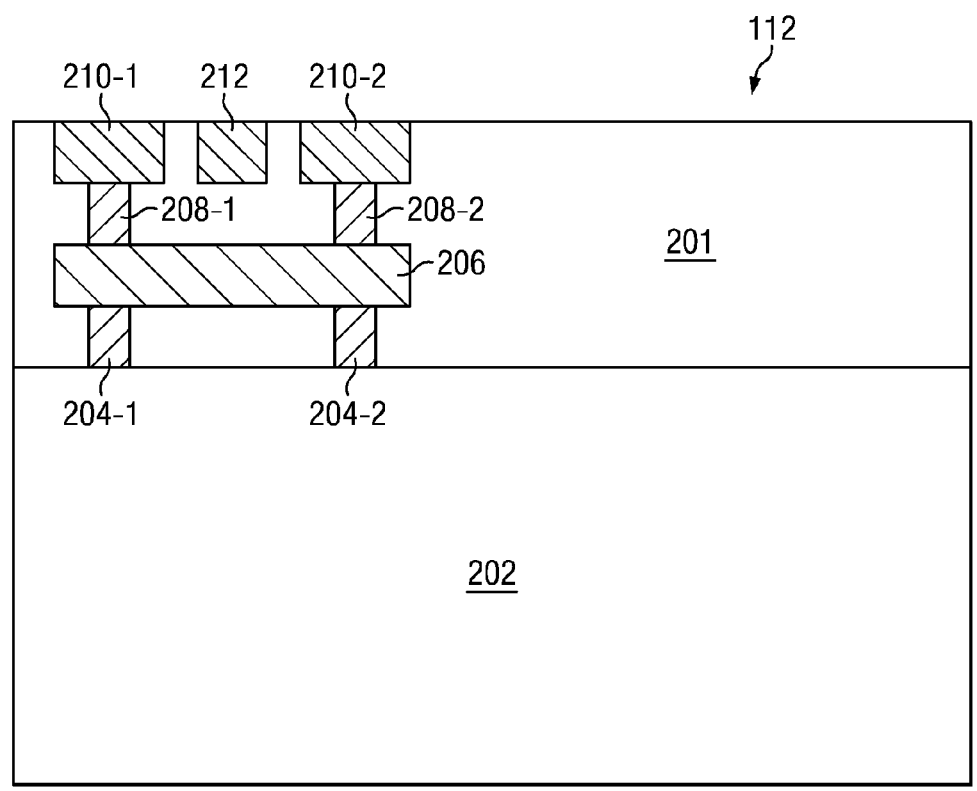
FIG. 5B is a cross-sectional view of FIG. 5A along section line 4-4.
Figure 6A:
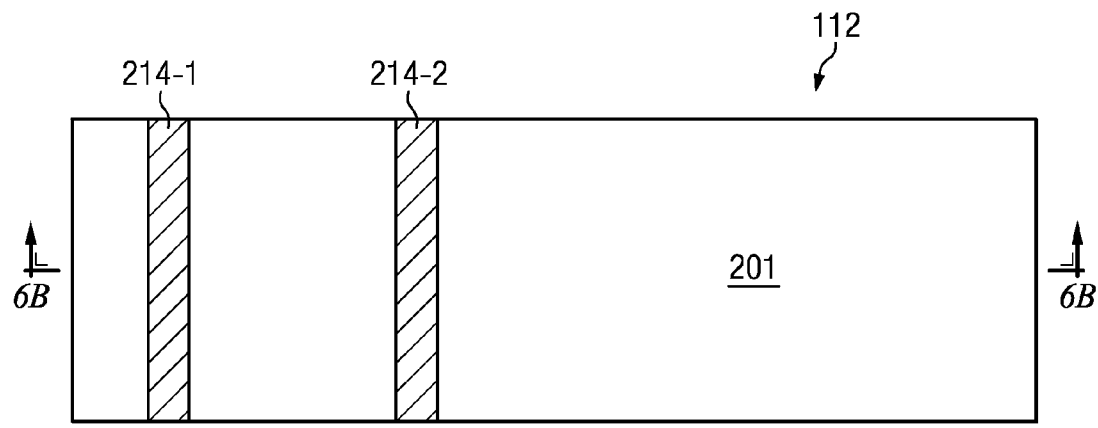
FIG. 6A is plan view of the formation of inner and outer via layers for a portion of the metal ring of FIG. 1B.
Figure 6B:
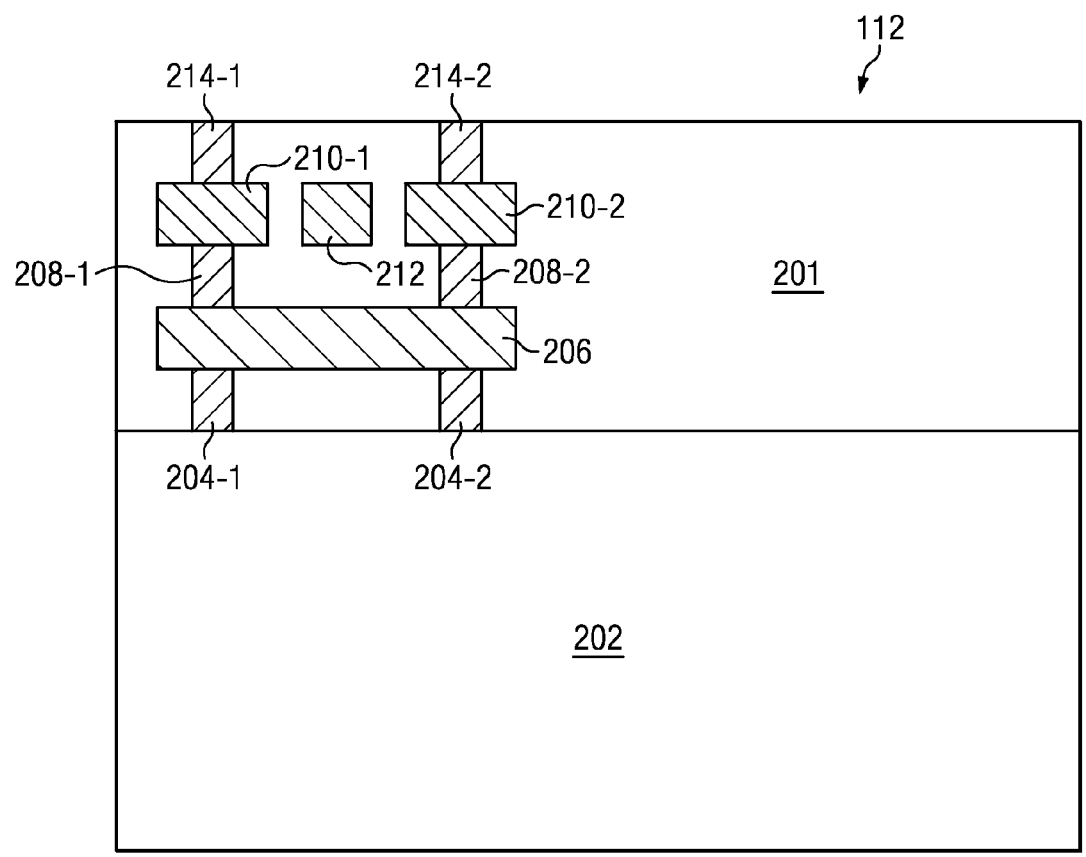
FIG. 6B is a cross-sectional view of FIG. 6A along section line 5-5.
Figure 7A:
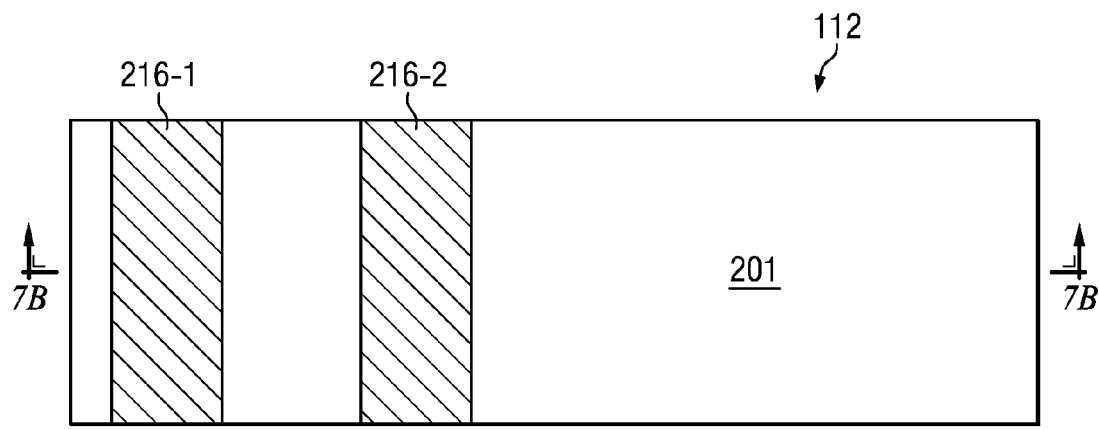
FIG. 7A is plan view of the formation of a metallization layer for a portion of the metal ring of FIG. 1B.
Figure 7B:
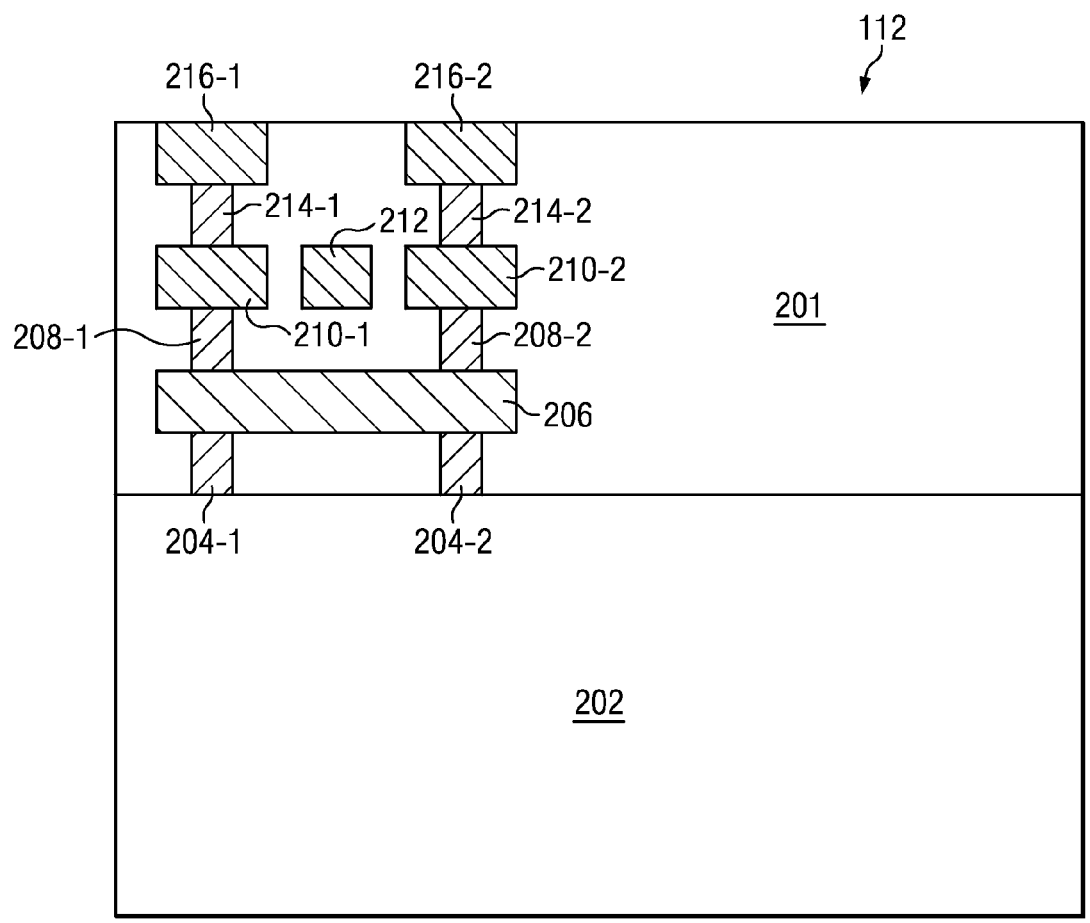
FIG. 7B is a cross-sectional view of FIG. 7A along section line 6-6.
Figure 8A:
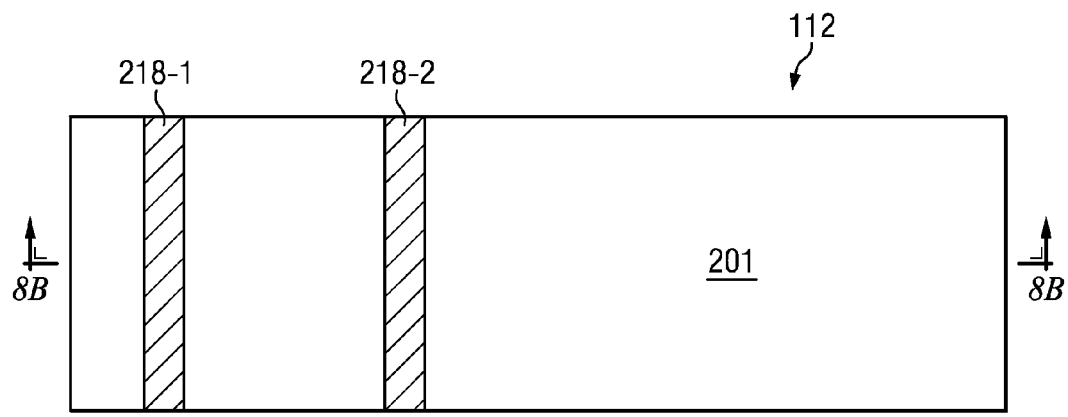
FIG. 8A is plan view of the formation of inner and outer via layers for a portion of the metal ring of FIG. 1B.
Figure 8B:
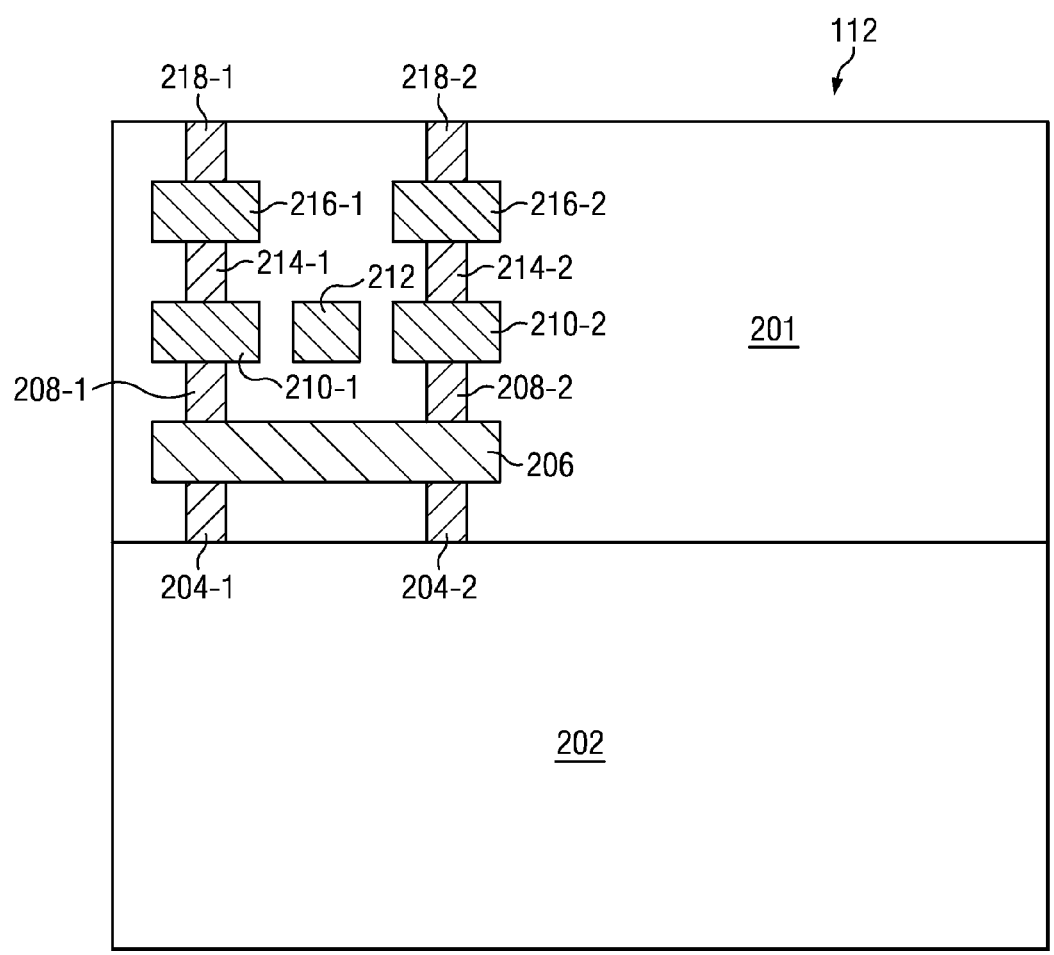
FIG. 8B is a cross-sectional view of FIG. 8A along section line 7-7.
Figure 9A:
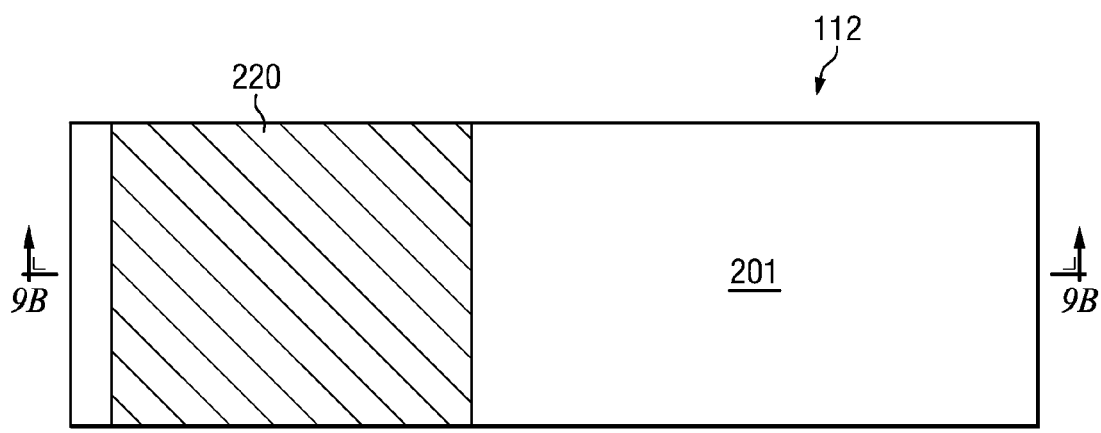
FIG. 9A is plan view of the formation of a metallization layer for a portion of the metal ring of FIG. 1B.
Figure 9B:
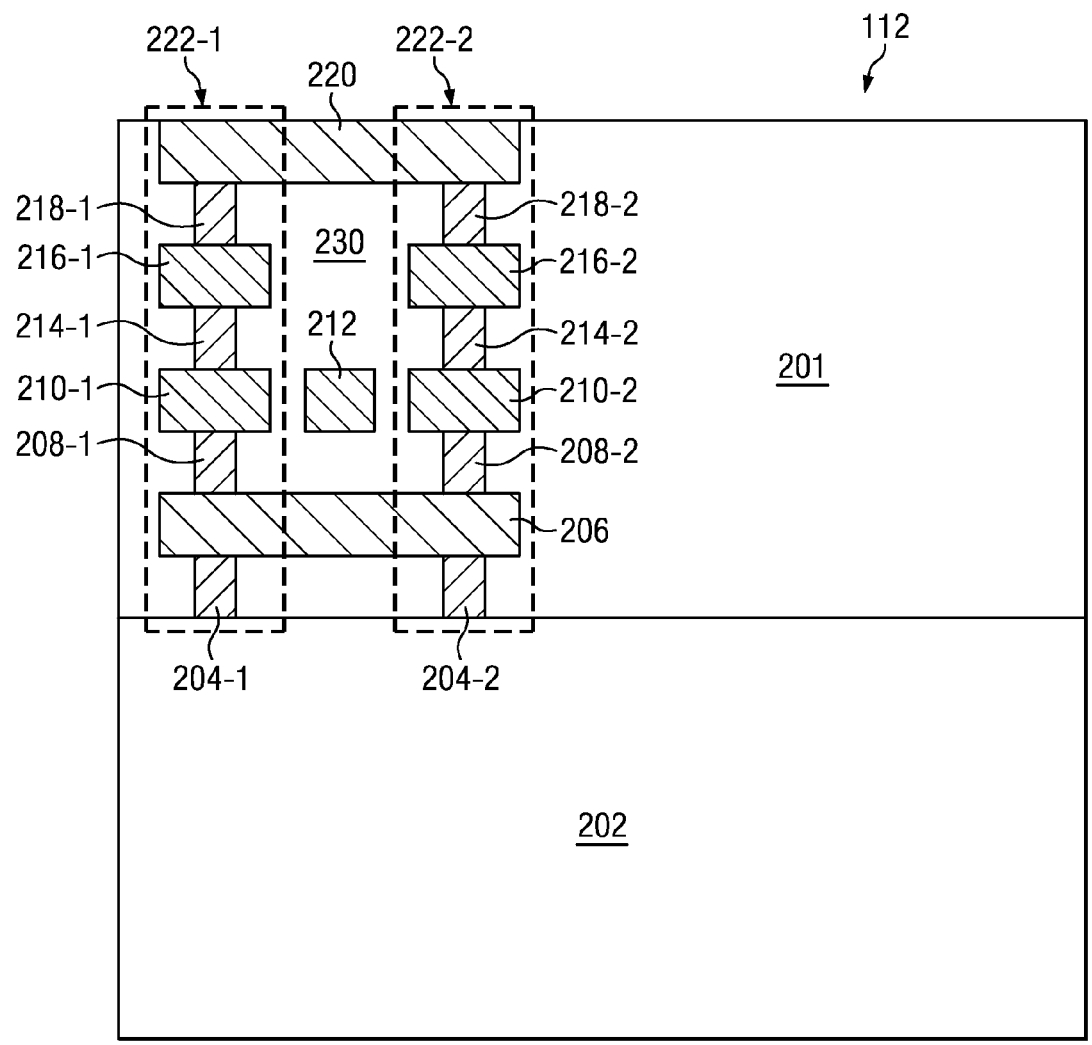
FIG. 9B is a cross-sectional view of FIG. 9A along section line 8-8.

Turning to FIG. 1B, thermopile 102 can be seen in greater detail. This thermopile 102 generally comprises functional area 108 that employs the Seebeck effect to generate an electrical current based on a temperature difference between "cold" and "hot" junctions. As part of the formation of the thermopile 102, openings or holes (i.e., 110) are formed in the functional area 108 that penetrate a protective overcoat or passivation layer (i.e., silicon nitride layer) and extends down to the substrate 202 shown in FIG. 2B. This allows the substrate underneath most of the functional area 108 to be etched. The recesses or cavities formed in the substrate from the etching process help to form "hot" junctions in the center of the functional area 108, and "cold" junctions along the periphery of the functional area 108. A metal ring 106 is also formed along the periphery of the functional area 108 of thermopile 102. This metal ring 106 is generally comprised of several metallization layers that are thermally coupled (thermal short) to the substrate. By having this "thermal short," it allows the functional area 108 (which is membrane) to have a generally fixed or constant thermal conductivity. This generally constant thermal conductivity provides high accuracy and reduces the functional area's 108 sensitivity to fatigue caused by changes in atmospheric pressure.

Turning now to FIGS. 2A to 9B, a portion of the process of the formation of the metal ring 106 can be seen for portion 112 of FIG. 1B. Typically, the metal ring 106 is formed at substantially the same time as the functional area 108. The metal ring 106 is generally comprised of an inner barrier ring 222-2 and an outer barrier ring 222-1, where each is formed of a set or stack of thermally conductive layers over substrate 202. These barrier rings 222-1 and 222-2 are generally parallel to one another along the periphery of functional area 108 with a circuit trace region 230 therebetween (which has a circuit trace 212 formed therein). The circuit trace region 230 is generally comprised of a set or stack of dielectric layers 201 (i.e., silicon dioxide); this set of dielectric layers 201 also forms a portion of functional area 108. The stacks of thermally conductive layers forming barrier rings 222-1 and 222-2 generally include inner via layers 204-2, 208-2, 214-2, and 218-2 (which are generally aligned with one another) and outer via layers 204-1, 208-1, 214-1, and 218-1 (which are generally aligned with one another) that are generally continuous strips of thermally conductive materials (i.e., copper, aluminum, tungsten, etc.). Included between the via layers 204-1, 204-2, 208-1, 208-2, 214-1, 214-2, 218-1, and 218-2, are inner metallization layers 210-2 and 216-2 (which are generally aligned with the inner via layers 204-2, 208-2, 214-2, and 218-2) and outer metallization layers 210-1 and 216-1 (which are generally aligned with outer via layers 204-1, 208-1, 214-1, and 218-1). To help isolate a portion of the circuit trace region 230, an upper metallization layer 220 and lower metallization layer 206 are provided, which extend between barrier rings 222-1 and 222-2 through the circuit trace region 230. Additionally, metallization layers 206, 210-1, 210-2, 216-1, 216-2, and 220 are formed of an thermally conductive metal (i.e., aluminum or copper).

Figure 10A:
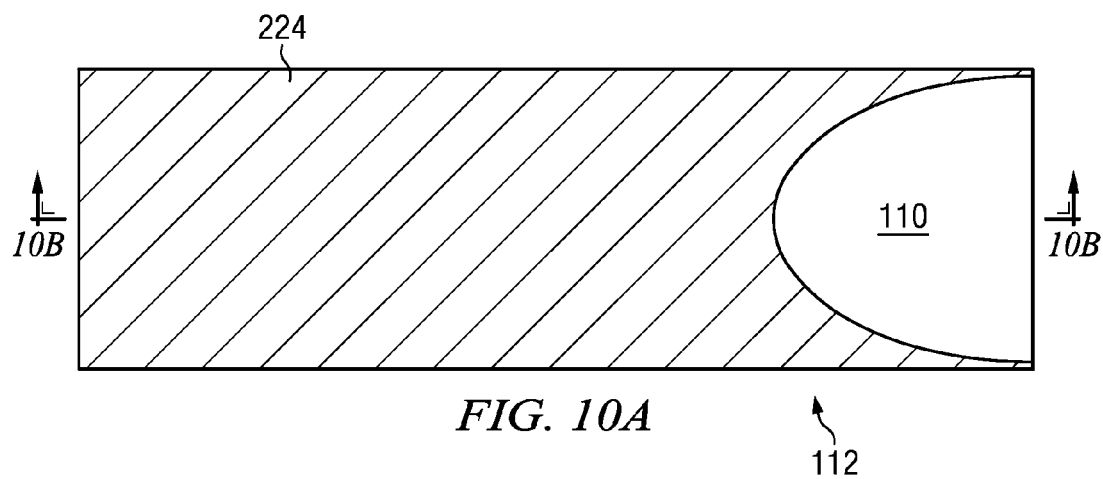
FIG. 10A is a plan view of the formation of the cavity.
Figure 10B:
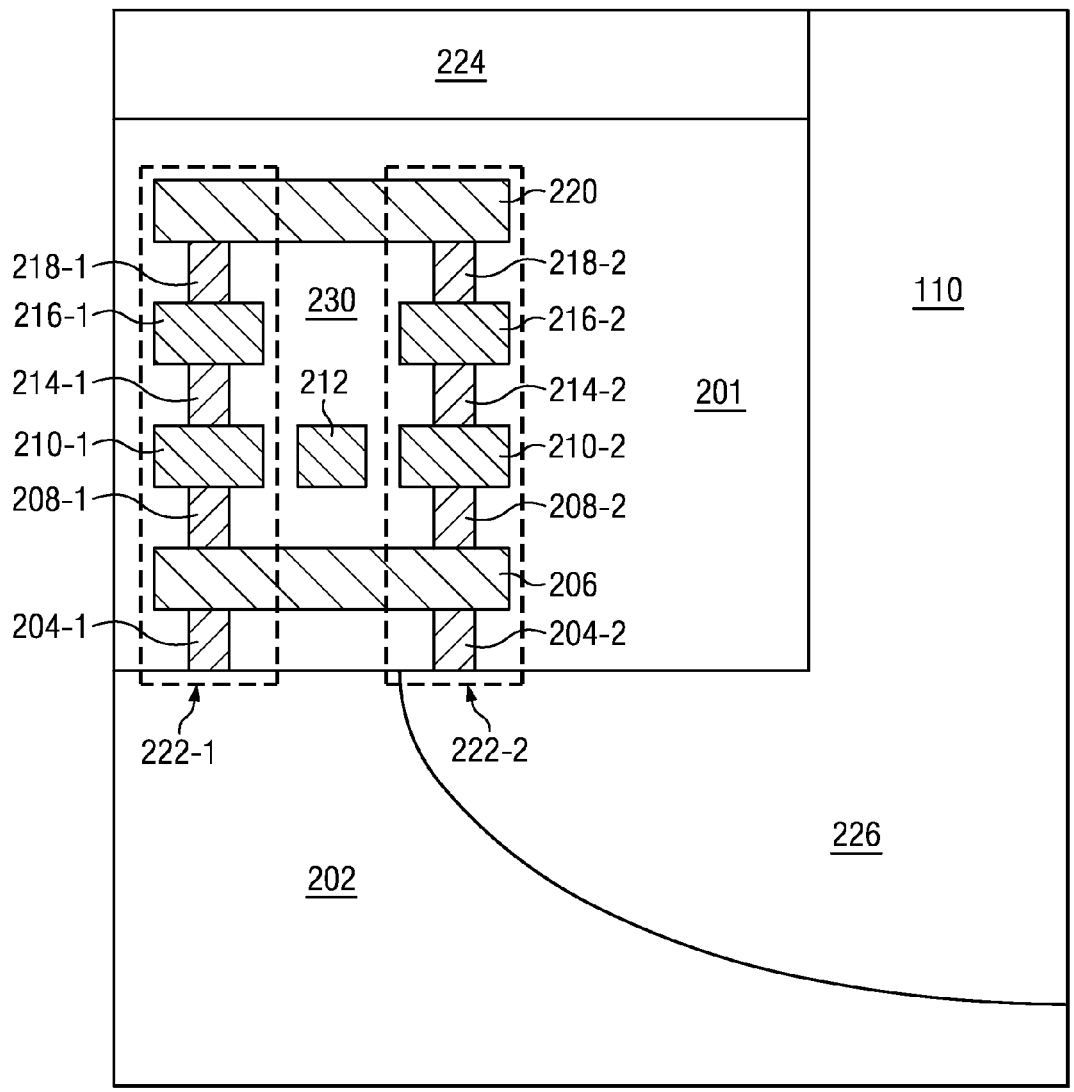
FIG. 10B is a cross-sectional view of FIG. 10A along line 9-9.
Figure 11A:
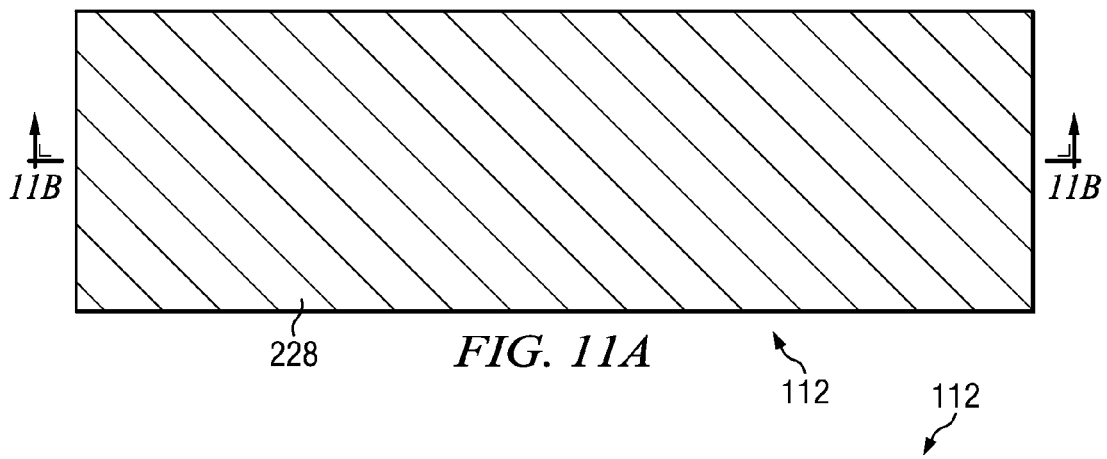
FIG. 11A is a plan view of the formation of the cover plate.
Figure 11B:
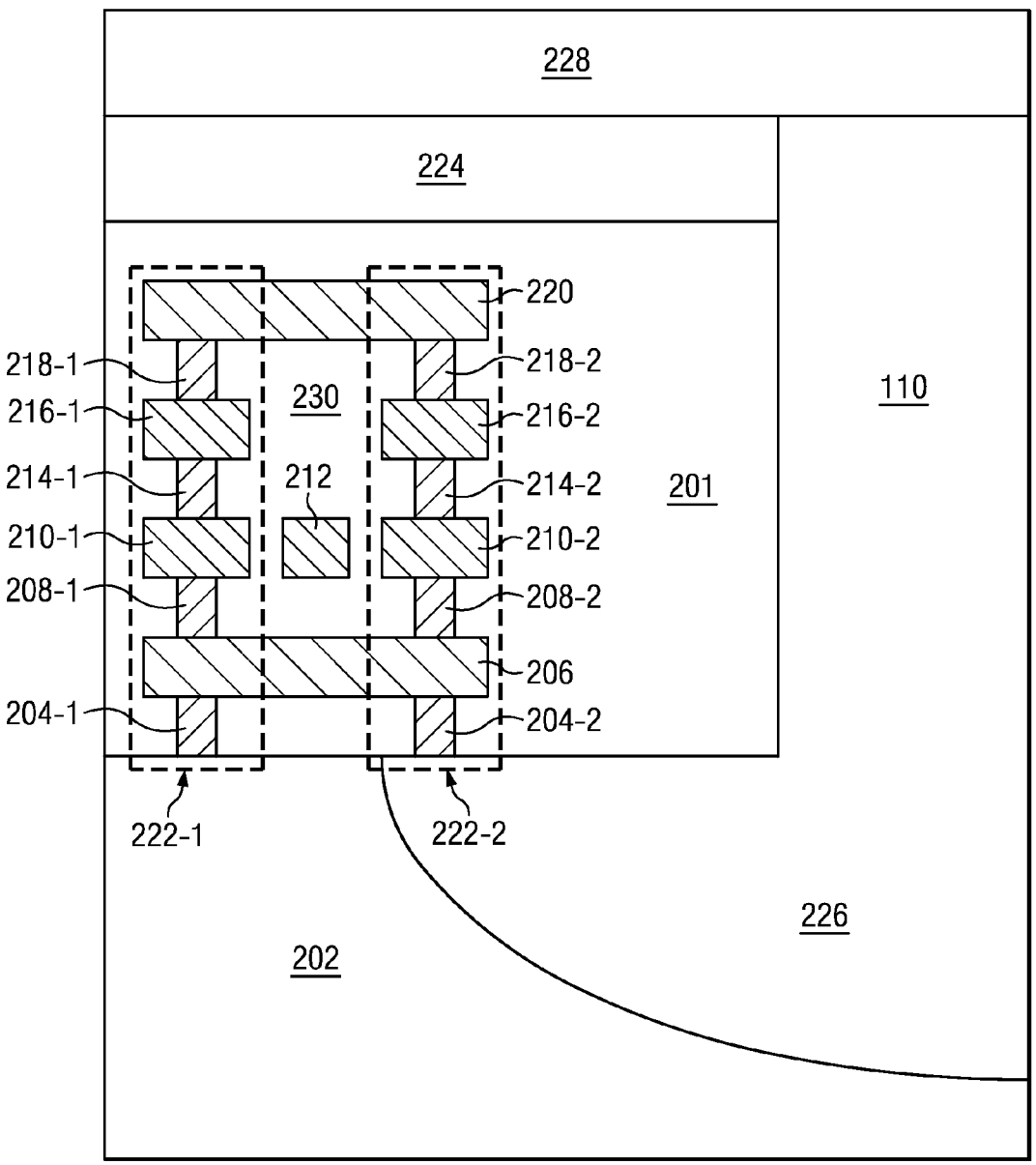
FIG. 11B is a cross-sectional view of FIG. 11A along section line 10-10.

As shown in FIGS. 10A and 10B, a protective overcoat or passivation layer 224 (i.e., silicon nitride layer) is formed over the thermocouple 102, which in many processes is one of the last steps; however, for thermopile 102, openings (i.e., 110) are formed through the protective overcoat 224 and functional area 108 to the substrate 202. The openings (i.e., 110) allow the portion of the substrate 202 underlying the functional area 108 to be etched, which forms cavity 226. In many cases, it can be difficult to control the etching of the cavity 226, so there is a potential for overetching (i.e., etching beyond the periphery of the functional area 108). The metal ring 106, nonetheless, can stabilize the thermal conductivity of the functional area 108. Finally, after the cavity 226 has been etched, a cover plate 228 (which can be formed of an epoxy) can be formed over the protective overcoat 224 so as to seal the openings (i.e., 110).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A method comprising:
forming a plurality of metallization layers and a functional area over a substrate, wherein each metallization layer is thermally coupled to the substrate, and wherein the plurality of metallization layers are generally aligned with one another so as to form a metal ring along the periphery of the functional area;
forming a passivation layer over a thermopile formed of the plurality of metallization layers and the functional area over the substrate;
forming a plurality of openings that extend through the passivation layer and the functional area to the substrate; and
etching the substrate underneath the functional area to form a cavity, wherein the cavity extends to the periphery of the functional area.

2. The method of claim 1, wherein the method further comprises forming a cover plate over the passivation layer to seal the plurality of openings.

3. The method of claim 2, wherein the step of forming the plurality of metallization layers and the thermopile on the substrate further comprises:
forming a first via layer formed over the substrate;
forming a first metallization layer formed over the first via layer;
forming a second via layer formed over the first metallization layer;
forming a second metallization layer formed over the second via layer;
forming a third via layer formed over the second metallization layer, wherein the first, second, and third via layers are formed of a thermally conductive material; and
forming a third metallization layer that is formed over the third via layer.

4. The method of claim 3, wherein the cover plate is formed of an epoxy, and wherein the first, second, and third via layers are each formed of copper, aluminum, or tungsten, and wherein the first second and third metallization layers are formed of aluminum or copper.

* * * * *